United States Patent
Niu et al.

(10) Patent No.: US 11,495,623 B2
(45) Date of Patent: Nov. 8, 2022

(54) DISPLAY SUBSTRATE AND MANUFACTURING METHOD THEREOF, DISPLAY DEVICE

(71) Applicant: BOE Technology Group Co., Ltd., Beijing (CN)

(72) Inventors: Yanan Niu, Beijing (CN); Kuanjun Peng, Beijing (CN); Jiushi Wang, Beijing (CN); Zhanfeng Cao, Beijing (CN); Feng Zhang, Beijing (CN); Qi Yao, Beijing (CN); Wusheng Li, Beijing (CN); Feng Guan, Beijing (CN); Lei Chen, Beijing (CN); Jintao Peng, Beijing (CN); Tingting Zhou, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 328 days.

(21) Appl. No.: 16/772,272

(22) PCT Filed: Dec. 19, 2019

(86) PCT No.: PCT/CN2019/126652
§ 371 (c)(1),
(2) Date: Jun. 12, 2020

(87) PCT Pub. No.: WO2020/140763
PCT Pub. Date: Jul. 9, 2020

(65) Prior Publication Data
US 2021/0225877 A1      Jul. 22, 2021

(30) Foreign Application Priority Data

Jan. 3, 2019    (CN) .......................... 201910003413.8

(51) Int. Cl.
*H01L 27/12* (2006.01)

(52) U.S. Cl.
CPC .......... *H01L 27/124* (2013.01); *H01L 27/127* (2013.01); *H01L 27/1237* (2013.01)

(58) Field of Classification Search
CPC ..... H01L 27/124–1244; H01L 27/1251; H01L 27/1225; H01L 29/7869–78693
See application file for complete search history.

(56) References Cited

U.S. PATENT DOCUMENTS 6,211,549 B1    4/2001 Funaki et al.

FOREIGN PATENT DOCUMENTS

CN    102890377 A    1/2013
CN    103715196 A    4/2014
(Continued)

OTHER PUBLICATIONS

First Office Action dated May 15, 2020 for application No. CN201910003413.8 with English translation attached.
(Continued)

*Primary Examiner* — Amar Movva
(74) *Attorney, Agent, or Firm* — Nath, Goldberg & Meyer; Joshua B. Goldberg

(57) ABSTRACT

The present disclosure provides a display substrate and a manufacturing method thereof, and a display device. In the display substrate of the present disclosure, a first transistor comprises a first gate electrode, a first electrode, a second electrode, and a first active layer; and a second transistor comprises a second gate electrode, a third electrode, a fourth electrode, and a second active layers, wherein the first active layer comprises a silicon material, the second active layer comprises an oxide semiconductor material, and wherein the third electrode and the first gate electrode are disposed in the same layer, and the fourth electrode and the first electrode, the second electrodes are disposed in the same layer.

20 Claims, 2 Drawing Sheets

(56) References Cited

FOREIGN PATENT DOCUMENTS

| | | |
|---|---|---|
| CN | 103730508 A | 4/2014 |
| CN | 107735865 A | 2/2018 |
| CN | 107818989 A | 3/2018 |
| CN | 107910376 A | 4/2018 |
| CN | 109728002 A | 5/2019 |
| JP | 2005317619 A | 11/2005 |

OTHER PUBLICATIONS

Second Office Action dated Nov. 24, 2020 for application No. CN201910003413.8 with English translation attached.

DISPLAY SUBSTRATE AND MANUFACTURING METHOD THEREOF, DISPLAY DEVICE

This is a National Phase Application filed under 35 U.S.C. 371 as a national stage of PCT/CN2019/126652, filed on Dec. 19, 2019, an application claiming the benefit of Chinese Application No. 201910003413.8, filed on Jan. 3, 2019 the content of each of which is hereby incorporated by reference in its entirety.

TECHNICAL FIELD

The present disclosure relates to the field of display technology, more particularly, to a display substrate and a manufacturing method thereof, a display device.

BACKGROUND

In the prior art, it has appeared that silicon-based transistors and oxide semiconductor-based transistors are manufactured on the same display substrate, where the silicon-based transistors and the oxide semiconductor-based transistors both are lateral (i.e., horizontal) transistors. Limited by driving capability of the lateral oxide semiconductor-based transistor and stability of the device employing the same, an interlayer dielectric layer (which is usually made of inorganic material) in the lateral oxide semiconductor-based transistor is thick, and cracks are likely to occur in the interlayer dielectric layer in the oxide semiconductor-based transistor, which lead to a decrease of an insulation performance thereof, and a tendency to cause poor leakage and breakdown, thereby reducing the reliability of the display substrate.

SUMMARY

In one aspect, the present disclosure provides a display substrate, including: a first transistor on a base substrate and including a first gate electrode, a first electrode, a second electrode and a first active layer, wherein the first gate electrode is on a side of the first active layer away from the base substrate, the first electrode and the second electrode are on a side of the first gate electrode away from the base substrate, the first electrode and the second electrode are both connected with the first active layer; and a second transistor on the base substrate and on the same side of the base substrate as the first transistor, and including a second gate electrode, a third electrode, a fourth electrode and a second active layer, wherein the four electrode is on a side of the third electrode away from the base substrate, the second active layer covers side surfaces of the third electrode and the fourth electrode and is connected with the third electrode and the fourth electrode, the second gate electrode is on a side of the second active layer away from the base substrate; wherein the first transistor is a horizontal thin film transistor; and the second transistor is a vertical thin film transistor; wherein the first active layer includes a silicon material, and the second active layer includes an oxide semiconductor material; and wherein the third electrode is in the same layer as the first gate electrode, and the fourth electrode is in the same layer as the first electrode and the second electrode.

According to some embodiments of the present disclosure, the second active layer includes a first portion and a second portion, the first portion covers the side surfaces of the third electrode and the fourth electrode and is electrically connected with the third electrode and the fourth electrode; the third electrode and the fourth electrode are on a same side of the first portion; and the second portion is substantially parallel to the base substrate.

According to some embodiments of the present disclosure, the first transistor further includes a first gate insulating layer between the first active layer and the first gate electrode; wherein the first active layer is on a side of the first gate insulating layer close to the base substrate.

According to some embodiments of the present disclosure, the second transistor further includes a second gate insulating layer between the second active layer and the second gate electrode, wherein the second active layer is on a side of the second gate insulating layer close to the base substrate, and an orthographic projection of the second gate insulating layer on the base substrate covers an orthographic projection of the second active layer on the base substrate.

According to some embodiments of the present disclosure, the display substrate further includes: a buffer layer on a side of the first active layer close to the base substrate; a driving electrode on a side of the fourth electrode away from the base substrate; and a planarization layer on a side of the driving electrode close to the base substrate.

In another aspect, the present disclosure also provides a display device including the display substrate described herein, and one or more integrated circuits connected with the display substrate.

In another aspect; the present disclosure also provides a manufacturing method of a display substrate, including: forming a first transistor on a base substrate, the first transistor being formed as a horizontal thin film transistor and including a first gate electrode, a first electrode, a second electrode, and a first active layer; forming a second transistor on a same side of the base substrate, the second transistor being formed as a vertical thin film transistor and including a second gate electrode, a third electrode, a fourth electrode and a second active layer, wherein the first active layer includes a silicon material, the second active layer includes an oxide semiconductor material, and wherein the third electrode is formed in the same layer as the first gate electrode, and the fourth electrode is formed in the same layer as the first electrode and the second electrode.

According to some embodiments of the present disclosure, the forming a first transistor and the forming a second transistor include: forming the first active layer on the base substrate; forming a first gate insulating layer on a side of the first active layer away from the base substrate; forming the first gate electrode and the third electrode on a side of the first gate insulating layer away from the base substrate by one patterning process, the first gate electrode and the third electrode being formed to be separated from each other; forming an interlayer dielectric layer on a side of the first gate electrode and the third electrode away from the base substrate; forming the first electrode, the second electrode and the fourth electrode on a side of the interlayer dielectric layer away from the base substrate by one patterning process, the first electrode and the second electrode being formed to be connected with the first active layer; forming a groove in a predetermined region of the first gate insulating layer and the interlayer dielectric layer to expose a side surface of the third electrode; forming the second active layer in the groove, the second active layer being formed to be connected with side surfaces of the third electrode and the fourth electrode, and the third electrode and the fourth electrode being on a same side of the second active layer; forming the second gate insulating layer on a side of the second active layer away from the base substrate; and forming the second gate electrode on a side of the second gate insulating layer away from the base substrate.

According to some embodiments of the present disclosure, the forming the second gate insulating layer on a side of the second active layer away from the base substrate includes: forming a second gate insulating material film on the side of the second active layer away from the base substrate; performing a patterning process on the second gate insulating material film to form the second gate insulating layer; such that an orthographic projection of the second gate insulating layer on the base substrate covers an orthographic projection of the second active layer on the base substrate.

According to some embodiments of the present disclosure, the method further includes: before the forming the first active layer on the base substrate, forming a buffer layer on the base substrate to cover the base substrate, wherein the groove is formed such that a bottom surface of the groove is at the same level as a surface of the buffer layer at a side of the buffer layer away from the base substrate.

According to some embodiments of the present disclosure, the method further includes: forming a gate line in a predetermined region on a side of the interlayer dielectric layer away from the base substrate, such that the gate line is connected with the first gate electrode.

According to some embodiments of the present disclosure, the method further includes: forming a planarization layer on a side of the first transistor and the second transistor away from the base substrate to cover the first transistor and the second transistor.

According to some embodiments of the present disclosure, the method further includes: forming a groove in the planarization layer, the groove being formed such that the bottom surface of the groove is at the same level as a surface of the fourth electrode at a side of the fourth electrode away from the base substrate; and forming a driving electrode in the groove, the driving electrode being formed to be connected with the fourth electrode.

According to some embodiments of the present disclosure, the second gate insulating layer is formed such that the orthographic projection of the second gate insulating layer on the base substrate completely overlaps the orthographic projection of the second active layer on the base substrate.

BRIEF DESCRIPTION OF THE FIGURES

The drawings in the following description are only examples for illustrative purposes according to the disclosed various embodiments, and are not intended to limit the scope of the present invention.

DETAILED DESCRIPTION

To make those skilled in the art better understand the technical solutions of the present disclosure, the present disclosure will be further described in detail below in conjunction with the accompanying drawings and embodiments. It is noted that the following description of some embodiments has been presented for purposes of illustration and description. It is not intended to be exhaustive or to limit the precise forms disclosed, and the repeated description is omitted in order to avoid redundancy.

The present disclosure provides, inter alia, a display substrate and a manufacturing method thereof, and a display device that substantially obviate one or more of the problems due to limitations and disadvantages of the related art. In one aspect, the present disclosure provides a display substrate. In some embodiments, the display substrate includes: a first transistor on a base substrate and including a first gate electrode; a first electrode, a second electrode and a first active layer; and a second transistor on the base substrate and on the same side of the base substrate as the first transistor, and including a second gate electrode, a third electrode, a fourth electrode and a second active layer, wherein the first transistor is a horizontal thin film transistor; and the second transistor is a vertical thin film transistor; wherein the first active layer includes a silicon material, and the second active layer includes an oxide semiconductor material; and wherein the third electrode is in the same layer as the first gate electrode, the fourth electrode is in the same layer as the first electrode and the second electrode.

In the present application, the phrase "in a/the same layer" means that two or more elements are formed by the same material layer and are therefore in the same layer in a stacking relationship, but this does not mean that distances between these elements and the base substrate are equal, neither mean that structures of other layers between the elements and the base substrate are identical.

In the present application, the term "patterning process" refers to a step of forming a structure with a specific pattern, and may be a photolithography process, which includes one or more of the following steps: forming a material layer, coating a photoresist, exposing, developing, etching, stripping photoresist, and the like. In addition, the "patterning process" can also be other processes such as an imprinting process, an inkjet printing process, etc.

Figure 1:
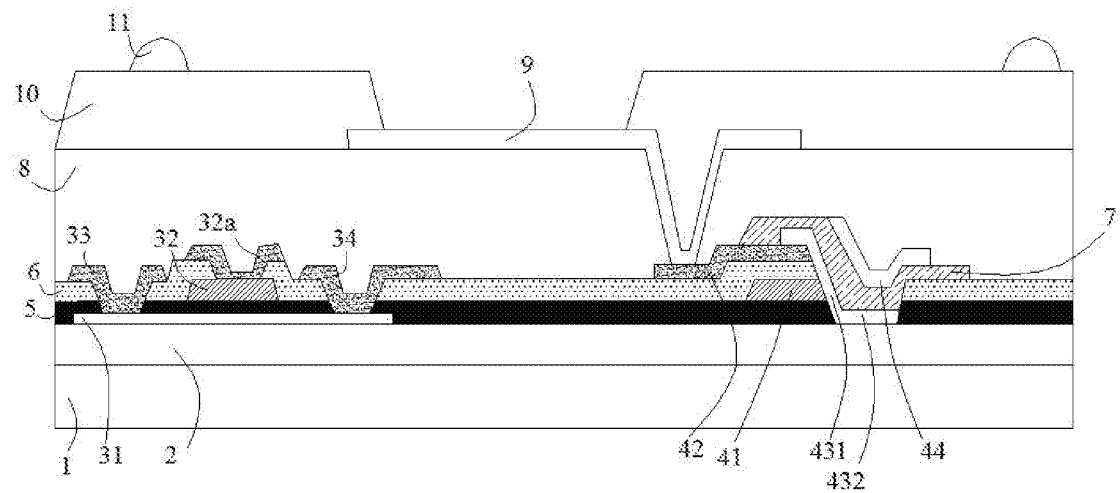
FIG. 1 is a schematic diagram illustrating a structure of a display substrate according to some embodiments of the present disclosure.

FIG. 1 is a schematic diagram illustrating a structure of a display substrate according to some embodiments of the present disclosure. Referring to FIG. 1, the display substrate includes a base substrate 1, a first transistor and a second transistor provided on the base substrate 1, wherein the first transistor is a horizontal thin film transistor, and the second transistor is a vertical thin film transistor. The first transistor includes a first gate electrode 32, a first electrode 33, a second electrode 34 and a first active layer 31. The second transistor includes a second gate electrode 44, a third electrode 41, a fourth electrode 42 and a second active layer. The first active layer 31 includes a silicon material, and the second active layer includes an oxide semiconductor material. The third electrode 41 is disposed in the same layer as the first gate electrode 32, and the fourth electrode 42 is disposed in the same layer as the first electrode 33 and the second electrode 34.

In the display substrate having the above structure, the second transistor is a vertical thin film transistor, the third electrode 41 of the second transistor is formed by a material layer for forming the first gate electrode 32 of the first transistor, the fourth electrode 42 of the second transistor is formed by a material layer for forming the first electrode 33 of the first transistor, and the third electrode 41 and the fourth electrode 42 in the second transistor are spaced apart by an interlayer dielectric layer 6 manufactured when the first transistor is formed.

In the present application, a horizontal thin film transistor refers to a transistor in which carriers move in a horizontal direction of a cross section of the transistor due to the structure of the transistor, that is to say, the carriers in a channel of the transistor move in a direction parallel to the base substrate; a vertical thin film transistor refers to a transistor in which carriers move in a vertical direction of a cross section of the transistor due to the structure of the transistor, that is to say, the carriers in a channel of the transistor move in a direction perpendicular to the base substrate.

Since there is no need to provide the oxide semiconductor-based thin film transistor with a thick interlayer dielectric layer as in the prior art, a thickness of an inorganic substance in the display substrate can be reduced. In addition, since the third electrode and the fourth electrode (i.e., the source and drain electrodes) in the second transistor are both arranged in the same layer as that in the first transistor, t the number of electrodes (which are also the inorganic substance) configured to form the second transistor is further reduced. The above effects both reduce the thickness of the inorganic substance in the display substrate, which is beneficial to improve the reliability of the display substrate.

In some embodiments, a first gate insulating layer 5 is provided between the first active layer 31 and the first gate electrode 32, the first active layer 31 is located on a side of the first gate insulating layer 5 close to the base substrate 1, that is to say, the first transistor is a top-gate thin film transistor. Of course, the first transistor applied in the present application may also be a bottom-gate thin film transistor.

In some embodiments, the second active layer includes a first portion 431 which is located on side surfaces of the third electrode 41 and the fourth electrode 42, and the third electrode 41 and the fourth electrode 42 are located on the same side of the first portion 431; the side surface of the third electrode 41 facing the first portion 431 and the side surface of the fourth electrode 42 facing the first portion 431 are both connected and in contact with the first portion 431. The first part 431 is connected with the third electrode 41 and the fourth electrode 42. In subsequent applications, a conductive channel is formed in the first portion 431.

In some embodiments, a first wile insulating layer 5 is provided between the first active layer 31 and the first gate electrode 32, and the first active layer 31 is located on a side of the first gate insulating layer 5 close to the base substrate 1. The display substrate also includes a buffer layer 2 disposed between the base substrate 1 and the first active layer 31 and laid in a whole layer to cover the base substrate 1, and the first active layer 31 is in contact with the buffer layer 2. The second active layer further includes a second portion 432 connected with the first portion 431, and the second portion 432 is substantially parallel to the base substrate 1 and in contact with a surface of the buffer layer 2 away from the base substrate 1 when it is allowable in the manufacturing process.

The second portion 432 is provided to ensure that a contact portion between the third electrode 41 and the second active layer is not too close to a boundary of the second active layer. In this embodiment, the second portion 432 is located on an upper surface of the buffer layer 2. Of course, the position of the second portion 432 may be further away from the base substrate 1 than that in this embodiment, and the function of the second transistor may also be achieved.

In some embodiments, a second gate insulating layer 7 is provided between the second active layer and the second gate electrode 44, an orthographic projection of the second gate insulating layer 7 on the base substrate 1 completely overlaps an orthographic projection of the second active layer on the base substrate 1. Since a role of the second gate insulating layer 7 is only to separate the second gate electrode 44 from the second active layer, an area of the second gate insulating layer 7 can be as small as possible, so as to further reduce the thickness of the inorganic substance in the display substrate. In this extreme case, a boundary of the second gate insulating layer 7 is aligned to the boundary of the second active layer. Of course, the area of the second gate insulating layer 7 may be larger than that of this embodiment, as shown in FIG. 1. In some embodiments, the second gate insulating layer 7 may also be configured such that its orthographic projection on the base substrate 1 does not overlap the orthographic projection of the first transistor on the base substrate 1.

In another aspect, the present disclosure provides a display device including the display substrate described herein or manufactured by the method described herein and one or more integrated circuits connected to the display substrate. Specifically, the display device may be any product or component with a display function such as a liquid crystal display panel, an organic light emitting diode (OLED) display panel, a mobile phone, a tablet computer, a television, a display, a notebook computer, a digital photo frame, a navigator, or the like.

In another aspect, the present disclosure provides a method of manufacturing a display substrate. In some embodiments, the method includes: forming a first transistor on the base substrate 1, wherein the first transistor is a horizontal thin film transistor, and includes a first gate electrode 32, a first electrode 33, a second electrode 34 and a first active layer 31, and the first active layer 31 includes a silicon material; forming a second transistor on the base substrate 1, wherein the second transistor is a vertical thin film transistor, and includes a second gate electrode 44, a third electrode 41, a fourth electrode 42 and a second active layer, and the second active layer includes an oxide semiconductor material, wherein the third electrode 41 is formed in the same layer as the first gate electrode 32, and the fourth electrode 42 is formed in the same layer as the first electrode 33 and the second electrodes 34.

That is to say, the first gate electrode 32 and the third electrode 41 are manufactured using the same material layer, and the fourth electrode 42, the first electrode 33 and the second electrode 34 are manufactured using the same material layer, so that the thickness of the inorganic substance in the display substrate can be reduced.

Figure 2A:
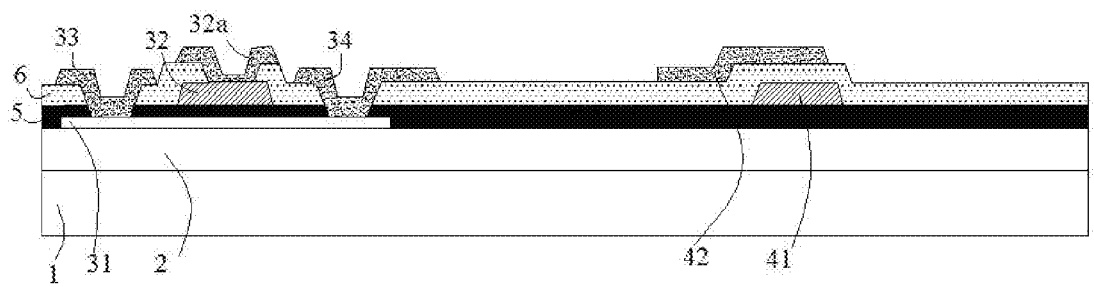
FIGS. 2A to 2C illustrate a method of manufacturing a display substrate according to some embodiments of the present disclosure.
Figure 2B:
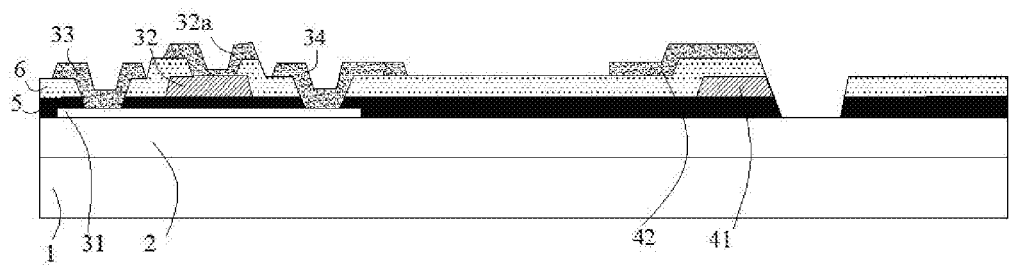
Figure 2C:
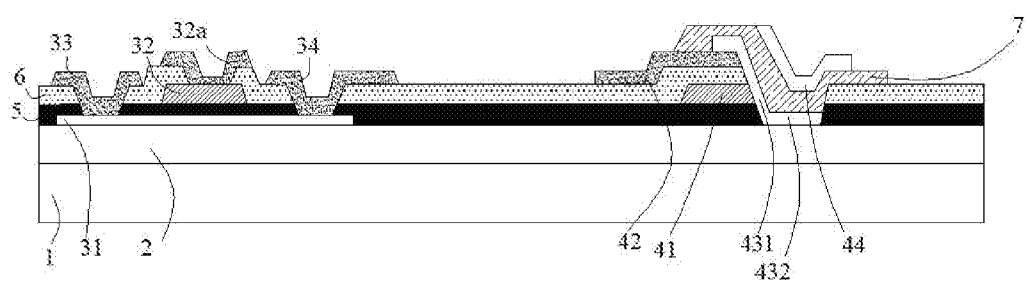

FIGS. 2A to 2C illustrate a method of manufacturing a display substrate according to some embodiments of the present disclosure. Referring to FIGS. 2A to 2C, the step of forming a first transistor and forming a second transistor specifically include the following first to ninth steps.

In the first step, the first active layer 31 made of the silicon material is formed on the base substrate 1. The base substrate 1 may be a flexible substrate or a rigid substrate such as glass. In some embodiments, the first active layer 31 may be formed after a barrier layer and a buffer layer 2 are formed on the base substrate 1. An outer shape of the first active layer 31 is obtained through a patterning process. The silicon material may be amorphous silicon, or polysilicon obtained by dehydrogenating and laser annealing the amorphous silicon.

In the second step, the first gate insulating layer 5 is formed on the side of the first active layer 31 away from the base substrate 1.

In the third step, the first gate electrode 32 and the third electrode 41 are formed on the side of the first gate insulating layer 5 away from the base substrate 1 through one patterning process. That is to say, the first gate electrode 32 of the first transistor and the third electrode 41 of the second transistor are simultaneously manufactured by using the same material layer.

In the fourth step, the first interlayer dielectric layer 6 is formed on the side of the first gate electrode 32 and the third electrode 41 away from the base substrate 1.

In the fifth step, the first electrode 33, the second electrode 34, and the fourth electrode 42 are formed on the side of the first interlayer dielectric layer 6 away from the substrate 1 through one patterning process, wherein the first electrode 33 and the second electrode 34 are formed to be connected to the first active layer 31, and the fourth electrode 42 and the third electrode 41 are formed to be sequentially arranged in a direction perpendicular to the base substrate 1. That is to say, the first electrode 33 and the second electrode 34 of the first transistor as well as the fourth electrode 42 of the second transistor are simultaneously formed using the same material layer. The product form at this time is shown in FIG. 2A. At this time, the gate line 32a may also be formed simultaneously.

In the sixth step, a groove is formed in a predetermined region on the first gate insulating layer 5 and the first interlayer dielectric layer 6 so that a side surface of the third electrode 41 is exposed, as shown in FIG. 2B. The purpose of forming the groove is to expose the side surface of the third electrode 41, and a side surface of the fourth electrode 42 is also exposed before forming the groove.

In some embodiments, in a case where the buffer layer 2 is formed in the display substrate, a bottom surface of the groove is at a same level as a surface of the buffer layer 2 away from the base substrate 1. In some embodiments, the bottom surface of the groove may also be slightly lower than the surface of the buffer layer 2 away from the base substrate 1, in practical applications, considering a width-to-length ratio of the groove and requirements of the process for the groove, the bottom surface of the groove may also be higher than the surface of the buffer layer 2 away from the base substrate 1, for example, only a portion of the first gate insulating layer 5 is removed during forming the groove.

In the seventh step, a second active layer is formed in the groove, the side surfaces of the third electrode 41 and the fourth electrode 42 are connected to the second active layer, and the third electrode 41 and the fourth electrode 42 are located on the same side of the second source layer. Since the side surfaces of the third electrode 41 and the fourth electrode 42 in the same direction are exposed after the sixth step is completed, and the second active layer is formed on these two side surfaces, thereby forming the vertical thin film transistor having the above structure.

In the eighth step, the second gate insulating layer 7 is formed on the side of the second active layer away from the base substrate 1. The second gate insulating layer 7 may have an entire layer structure, or may be arranged only in a region where the second transistor is provided. In some embodiments, forming the second gate insulating layer 7 specifically includes: firstly, forming a second gate insulating material film on the side of the second active layer away from the base substrate 1; subsequently, performing a patterning process on the second gate insulating material film to remove a portion of the second gate insulating material, where the remaining second gate insulating material constitutes the second gate insulating layer 7, and the orthographic projection of the second gate insulating layer 7 on the base substrate 1 covers the orthographic projection of the second active layer on the base substrate 1. In some embodiments, the orthographic projection of the second gate insulating layer 7 on the base substrate 1 completely overlaps the orthographic projection of the second active layer on the base substrate 1.

In the ninth step, the second gate 44 is formed on the side of the second gate insulating layer 7 away from the base substrate 1. Specifically, the shape of the second gate electrode 44 is obtained through a patterning process. The product form after this step is shown in FIG. 2C.

After the ninth step is completed, subsequent processes can be performed according to the existing technology. For example, as shown in FIG. 1, the structure having, for example, the planarization layer 8, the driving electrode 9 (which can be used as an anode of an organic light-emitting diode), a pixel defining layer 10, and a support pillar 11 may be subsequently formed. FIG. 1 shows a partial structure of an organic light emitting diode display substrate. Of course, the driving electrode 9 may also be used to drive the liquid crystal to change the orientation.

It is to be understood that the above description is only for the purpose of illustrating the principles of the present disclosure, but the disclosure is not limited thereto. Various modifications and improvements can be made by those skilled in the art without departing from the spirit and scope of the disclosure, and such modifications and improvements are also considered to be within the scope of the disclosure.

What is claimed is:

1. A display substrate, comprising:
    a first transistor on a base substrate and comprising a first gate electrode, a first electrode, a second electrode and a first active layer, wherein the first gate electrode is on a side of the first active layer away from the base substrate, the first electrode and the second electrode are on a side of the first gate electrode away from the base substrate, the first electrode and the second electrode are both connected with the first active layer; and
    a second transistor on the base substrate and on the same side of the base substrate as the first transistor, and comprising a second gate electrode, a third electrode, a fourth electrode and a second active layer, wherein the four electrode is on a side of the third electrode away from the base substrate, the second active layer covers side surfaces of the third electrode and the fourth electrode and is connected with the third electrode and the fourth electrode, the second gate electrode is on a side of the second active layer away from the base substrate;
    wherein the first transistor is a horizontal thin film transistor, and the second transistor is a vertical thin film transistor;
    wherein the first active layer comprises a silicon material, and the second active layer comprises an oxide semiconductor material; and
    wherein the third electrode is in the same layer as the first gate electrode, the fourth electrode is in the same layer as the first electrode and the second electrode.

2. The display substrate of claim 1, wherein the second active layer comprises a first portion and a second portion, the first portion covers the side surfaces of the third electrode and the fourth electrode and is electrically connected with the third electrode and the fourth electrode;
    the third electrode and the fourth electrode are on a same side of the first portion; and
    the second portion is substantially parallel to the base substrate.

3. The display substrate of claim 2, wherein
the second transistor further comprises a second gate insulating layer between the second active layer and the second gate electrode,
wherein the second active layer is on a side of the second gate insulating layer close to the base substrate, and
an orthographic projection of the second gate insulating layer on the base substrate covers an orthographic projection of the second active layer on the base substrate.

4. The display substrate of claim 3, further comprising:
a buffer layer on a side of the first active layer close to the base substrate;
a driving electrode on a side of the fourth electrode away from the base substrate; and
a planarization layer on a side of the driving electrode close to the base substrate.

5. A display device, comprising the display substrate according to claim 4 and one or more integrated circuits connected with the display substrate.

6. A display device, comprising the display substrate according to claim 3 and one or more integrated circuits connected with the display substrate.

7. The display substrate according to claim 2, wherein
the first transistor further comprises a first gate insulating layer between the first active layer and the first gate electrode,
wherein the first active layer is on a side of the first gate insulating layer close to the base substrate.

8. A display device, comprising the display substrate according to claim 2 and one or more integrated circuits connected with the display substrate.

9. The display substrate according to claim 1, wherein
the first transistor further comprises a first gate insulating layer between the first active layer and the first gate electrode,
wherein the first active layer is on a side of the first gate insulating layer close to the base substrate.

10. The display substrate of claim 9, wherein
the second transistor further comprises a second gate insulating layer between the second active layer and the second gate electrode,
wherein the second active layer is on a side of the second gate insulating layer close to the base substrate, and
an orthographic projection of the second gate insulating layer on the base substrate covers an orthographic projection of the second active layer on the base substrate.

11. A display device, comprising the display substrate according to claim 9 and one or more integrated circuits connected with the display substrate.

12. A display device, comprising the display substrate according to claim 1 and one or more integrated circuits connected with the display substrate.

13. A manufacturing method of a display substrate, comprising:
forming a first transistor on a base substrate, the first transistor being formed as a horizontal thin film transistor and comprising a first gate electrode, a first electrode, a second electrode, and a first active layer;
forming a second transistor on a same side of the base substrate, the second transistor being formed as a vertical thin film transistor and comprising a second gate electrode, a third electrode, a fourth electrode and a second active layer,
wherein the first active layer comprises a silicon material, the second active layer comprises an oxide semiconductor material, and
the third electrode is formed in the same layer as the first gate electrode, and the fourth electrode is formed in the same layer as the first electrode and the second electrode.

14. The manufacturing method of claim 13, wherein
the forming a first transistor and the forming a second transistor comprise:
forming the first active layer on the base substrate;
forming a first gate insulating layer on a side of the first active layer away from the base substrate;
forming the first gate electrode and the third electrode on a side of the first gate insulating layer away from the base substrate by one patterning process, the first gate electrode and the third electrode being formed to be separated from each other;
forming an interlayer dielectric layer on a side of the first gate electrode and the third electrode away from the base substrate;
forming the first electrode, the second electrode and the fourth electrode on a side of the interlayer dielectric layer away from the base substrate by one patterning process, the first electrode and the second electrode being formed to be connected with the first active layer;
forming a groove in a predetermined region of the first gate electrode insulating layer and the interlayer dielectric layer to expose a side surface of the third electrode;
forming the second active layer in the groove, the second active layer being formed to be connected with side surfaces of the third electrode and the fourth electrode, and the third electrode and the fourth electrode being on a same side of the second active layer;
forming the second gate insulating layer on a side of the second active layer away from the base substrate; and
forming the second gate electrode on a side of the second gate insulating layer away from the base substrate.

15. The manufacturing method of claim 14, wherein
the forming the second gate insulating layer on a side of the second active layer away from the base substrate comprises:
forming a second gate insulating material film on the side of the second active layer away from the base substrate;
performing a patterning process on the second gate insulating material film to form the second gate insulating layer, such that an orthographic projection of the second gate insulating layer on the base substrate covers an orthographic projection of the second active layer on the base substrate.

16. The manufacturing method of claim 15, further comprising:
before the forming the first active layer on the base substrate, forming a buffer layer on the base substrate to cover the base substrate,
wherein the groove is formed such that a bottom surface of the groove is at the same level as a surface of the buffer layer at a side of the buffer layer away from the base substrate.

17. The manufacturing method of claim 16, further comprising:
forming a gate line in a predetermined region on a side of the interlayer dielectric layer away from the base substrate, such that the gate line is connected with the first gate electrode.

18. The manufacturing method of claim 17, further comprising:
  forming a planarization layer on a side of the first transistor and the second transistor away from the base substrate to cover the first transistor and the second transistor.

19. The manufacturing method of claim 18, further comprising:
  forming a groove in the planarization layer, the groove being formed such that the bottom surface of the groove is at the same level as a surface of the fourth electrode at a side of the fourth electrode away from the base substrate; and
  forming a driving electrode in the groove,
  wherein the driving electrode is formed to be connected with the fourth electrode.

20. The manufacturing method of claim 15, wherein
  the second gate insulating layer is formed such that the orthographic projection of the second gate insulating layer on the base substrate completely overlaps the orthographic projection of the second active layer on the base substrate.

\* \* \* \* \*